(12) United States Patent
Kageyama et al.

(10) Patent No.: US 7,948,094 B2
(45) Date of Patent: May 24, 2011

(54) SEMICONDUCTOR DEVICE

(75) Inventors: Satoshi Kageyama, Kyoto (JP); Yuichi Nakao, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 222 days.

(21) Appl. No.: 12/255,886

(22) Filed: Oct. 22, 2008

(65) Prior Publication Data
US 2009/0102057 A1 Apr. 23, 2009

(30) Foreign Application Priority Data

Oct. 22, 2007 (JP) ................................. 2007-274043
Oct. 22, 2007 (JP) ................................. 2007-274044

(51) Int. Cl.
*H01L 23/52* (2006.01)
*H01L 23/48* (2006.01)
*H01L 29/40* (2006.01)

(52) U.S. Cl. ................ 257/786; 257/E23.151; 257/775; 257/776; 438/612; 438/666

(58) Field of Classification Search ........... 257/E23.142, 257/773, 775, 776, 751, 758, 762, 784, 786, 257/E23.151; 438/280, 612, 619, 638, 666
See application file for complete search history.

(56) References Cited

U.S. PATENT DOCUMENTS

| 4,941,031 | A | * | 7/1990 | Kumagai et al. | 365/149 |
|---|---|---|---|---|---|
| 5,315,138 | A | * | 5/1994 | Fukuda | 257/296 |
| 5,428,505 | A | * | 6/1995 | Sakemi et al. | 361/777 |
| 5,557,123 | A | * | 9/1996 | Ohta | 257/315 |
| 5,859,476 | A | * | 1/1999 | Onoda | 257/775 |
| 5,899,706 | A | * | 5/1999 | Kluwe et al. | 438/129 |
| 6,259,608 | B1 | * | 7/2001 | Berardinelli et al. | 361/777 |
| 6,417,572 | B1 | * | 7/2002 | Chidambarrao et al. | 257/773 |
| 6,521,531 | B2 | * | 2/2003 | Yoshizawa | 438/675 |
| 6,552,409 | B2 | * | 4/2003 | Taussig et al. | 257/529 |
| 6,646,351 | B2 | * | 11/2003 | Watanabe et al. | 257/760 |
| 6,717,267 | B1 | * | 4/2004 | Kunikiyo | 257/758 |
| 6,807,730 | B2 | * | 10/2004 | Bo | 29/840 |
| 6,836,019 | B2 | * | 12/2004 | Yang et al. | 257/774 |
| 6,869,872 | B2 | * | 3/2005 | Suh | 438/626 |
| 6,876,565 | B2 | * | 4/2005 | Meguro et al. | 365/72 |
| 7,208,781 | B2 | * | 4/2007 | Komatsu et al. | 257/209 |
| 7,410,897 | B2 | * | 8/2008 | Kanzawa | 438/637 |
| 7,470,620 | B2 | * | 12/2008 | Dubin et al. | 438/675 |
| 7,605,085 | B2 | * | 10/2009 | Tomita et al. | 438/700 |
| 7,683,425 | B2 | * | 3/2010 | Pang | 257/334 |

FOREIGN PATENT DOCUMENTS

JP 2001-326325 11/2001

* cited by examiner

*Primary Examiner* — Chris Chu

(74) *Attorney, Agent, or Firm* — Rabin & Berdo, PC

(57) ABSTRACT

The semiconductor device according to the present invention includes a semiconductor layer, an interlayer dielectric film formed on the semiconductor layer, a wire formed on the interlayer dielectric film with a metallic material to have a width of not more than 0.4 μm, and a broad portion integrally formed on the wire to extend from the wire in the width direction thereof.

25 Claims, 6 Drawing Sheets

101

SEMICONDUCTOR DEVICE

BACKGROUND OF THE INVENTION

1. Field of the Invention

The present invention relates to a semiconductor device having a fine wire.

2. Description of Related Art

In a semiconductor device, a wire made of a metallic material such as Al (aluminum) or Cu (copper) is formed on a semiconductor substrate provided with elements such as transistors through an interlayer dielectric film.

When a metallic material mainly composed of Al is employed as the material for the wire, for example, the wire (Al wire) is formed on a planar surface of the interlayer dielectric film.

When a metallic material mainly composed of Cu is employed as the material for the wire, on the other hand, the wire (Cu wire) is embedded in a trench formed in the interlayer dielectric film. The Cu wire is superior to the Al wire in a point that the same has smaller wiring resistance.

Semiconductor devices having multilayer interconnection structures include that employing Cu wires. In this semiconductor device, a first trench is formed in a first interlayer dielectric film formed on a semiconductor substrate, and a lower wire made of Cu is embedded in this first trench. A second interlayer dielectric film is laminated on the first interlayer dielectric film having the Cu wire embedded therein. A second trench is formed in the second interlayer dielectric film. Further, a via hole reaching the upper surface of the lower wire from the bottom surface of the second trench is formed in the second interlayer dielectric film. An upper wire as Cu wire is embedded in the second trench, while a via made of a metallic material mainly composed of Cu is embedded in the via hole. Thus, the upper and lower wires are electrically connected with each other through the via.

The uppermost Al or Cu wire is covered with a passivation film. In the multilayer interconnection structure, the Al or Cu wire other than the uppermost wire is covered with the interlayer dielectric film.

The interlayer dielectric film or the passivation film covering the corresponding wire (Al or Cu wire) is formed by CVD (Chemical Vapor Deposition), for example, after formation of the wire. The interlayer dielectric film or the passivation film is formed by CVD in a CVD apparatus under a high temperature of 300 to 400° C. After the formation of the interlayer dielectric film or the passivation film, therefore, the semiconductor device is taken out from the CVD apparatus, to be abruptly cooled to room temperature. At this time, the coefficients of thermal contraction of the metallic material forming the wire and an insulating material forming the interlayer dielectric film or the passivation film are so different that the interlayer dielectric film or the passivation film hinders contraction of the wire. Consequently, remarkable stress resulting from the thermal contraction difference between the wire and the interlayer dielectric film or the passivation film is applied to the wire.

In the conventional semiconductor device, the width of the wire is so large that the wire is not disconnected even if stress resulting from the thermal contraction difference between the wire and the interlayer dielectric film or the passivation film is applied thereto. In the semiconductor device including the Al wire, the Al wire is formed by stacking a layer made of Al and a layer made of a high-melting metal such as Ti (titanium), TiN (titanium nitride), TiW (titanium tungsten), Ta (tantalum) or TaN (tantalum nitride), and hence the wire is not disconnected even if stress resulting from the thermal contraction difference between the wire and the interlayer dielectric film or the passivation film is applied to the wire.

However, it has been recognized that, if the width of the wire is reduced to not more than 0.4 μm in order to refine the wire, the wire is disconnected when stress resulting from the thermal contraction difference between the wire and the interlayer dielectric film or the passivation film is applied thereto.

SUMMARY OF THE INVENTION

An object of the present invention is to provide a semiconductor device capable of preventing disconnection of a wire resulting from stress also when the width of the wire is not more than 0.4 μm.

A semiconductor device according to one aspect of the present invention includes: a semiconductor layer; an interlayer dielectric film formed on the semiconductor layer; a wire formed on the interlayer dielectric film with a metallic material to have a width of not more than 0.4 μm; and a broad portion integrally formed on the wire to extend from the wire in the width direction thereof.

In this semiconductor device, the interlayer dielectric film is formed on the semiconductor layer. The fine wire having the width of not more than 0.4 μm is formed on the interlayer dielectric film. The broad portion extending from the wire in the width direction thereof is integrally formed on the wire. Even if stress resulting from thermal contraction difference between the wire and a second interlayer dielectric film or a passivation film is applied to the wire after the second interlayer dielectric film or the passivation film is formed on the wire, therefore, the broad portion can absorb this stress. Consequently, the wire can be prevented from disconnection resulting from stress.

Preferably, a plurality of the broad portions are provided at a prescribed interval in a direction along the wire. The plurality of broad portions are so provided at the prescribed interval in the direction along the wire that the wire can be excellently prevented from disconnection.

In this case, the prescribed interval is preferably not less than 100 μm and not more than 300 μm. The interval between the broad portions is so set to not more than 300 μm that each pair of broad portions can excellently absorb stress applied to the wire between these broad portions. Further, the interval between the broad portions is so set to not less than 100 μm that the broad portions can be prevented from hindering refinement of the wire.

Preferably, the broad portions are arranged at regular intervals. The broad portions are so arranged at regular intervals that the wire can be prevented from partial stress concentration. Therefore, the wire can be more excellently prevented from disconnection resulting from stress.

A semiconductor device according to another aspect of the present invention includes: a lower wire; an interlayer dielectric film laminated on the lower wire; and an upper wire embedded in a wiring trench dug in the interlayer dielectric film from the upper surface thereof and made of a metallic material mainly composed of Cu, with a width of not more than 0.4 μm. A thick portion trench is dug in the wiring trench from the bottom surface of the wiring trench in a region not provided with the lower wire in plan view. The upper wire has a thick portion integrally formed by filling up the thick portion trench with the metallic material.

In this semiconductor device, the interlayer dielectric film is laminated on the lower wire. The wiring trench is dug in the interlayer dielectric film from the upper surface thereof. The upper wire having the width of not more than 0.4 μm is embedded in this wiring trench. The upper wire is made of the metallic material mainly composed of Cu. In the region not provided with the lower wire in plan view, the thick portion trench is dug in the interlayer dielectric film from the bottom surface of the wiring trench. The upper wire has the thick portion integrally formed by filling up the thick portion trench with the same metallic material as the upper wire.

Even if stress resulting from thermal contraction difference between the upper wire and the interlayer dielectric film having the upper wire embedded therein is applied to the upper wire, therefore, the thick portion can absorb this stress. Consequently, the upper wire can be prevented from disconnection resulting from stress.

Preferably, the thick portion trench penetrates through the interlayer dielectric film in the thickness direction.

A via hole penetrating through the interlayer dielectric film is formed between the upper and lower wires, and a via for electrically connecting the upper and lower wires with each other is embedded in the via hole. The thick portion trench so penetrates through the interlayer dielectric film that the via hole and the thick portion trench can be formed in the same step. Therefore, the thick portion trench can be formed without increasing the number of manufacturing steps.

The foregoing and other objects, features and effects of the present invention will become more apparent from the following detailed description of the embodiments with reference to the attached drawings.

DETAILED DESCRIPTION OF PREFERRED EMBODIMENTS

Embodiments of the present invention are now described in detail with reference to the attached drawings.

Figure 1:
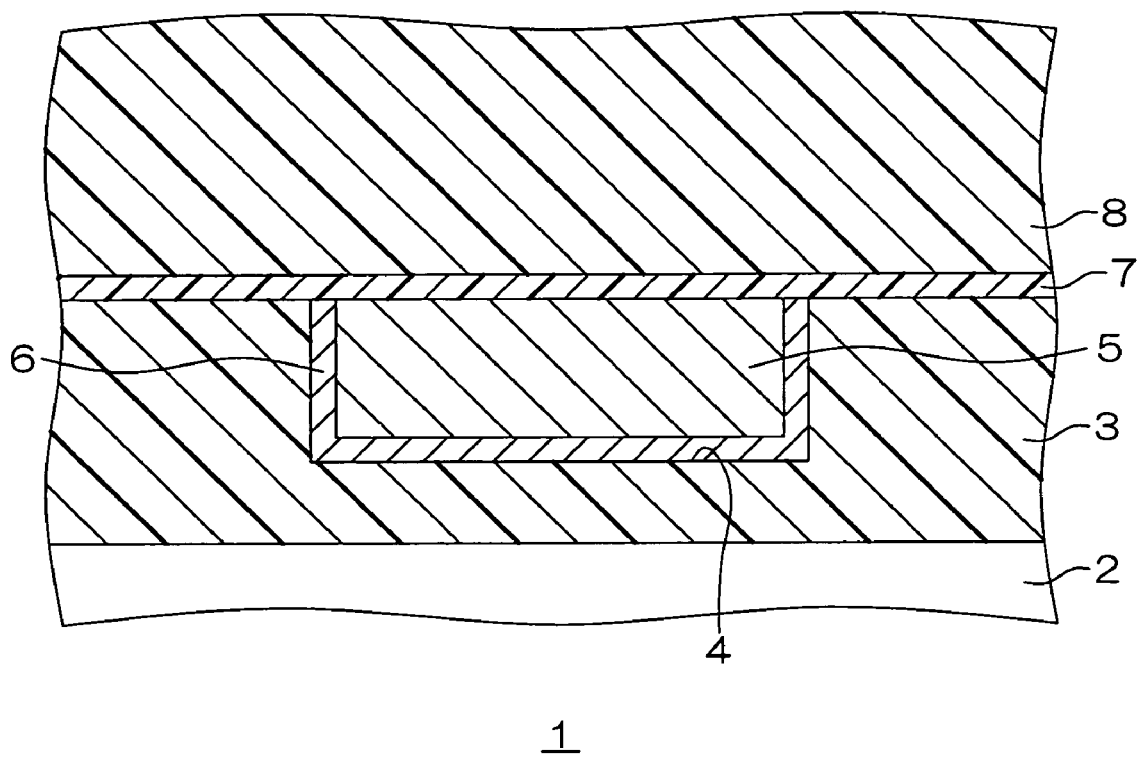
FIG. 1 is a schematic sectional view showing the structure of a semiconductor device according to a first embodiment of the present invention.

FIG. 1 is a schematic sectional view showing the structure of a semiconductor device according to a first embodiment of the present invention.

A semiconductor device 1 includes a semiconductor substrate 2 as a semiconductor layer. This semiconductor substrate 2 is formed by an Si (silicon) substrate, for example. Elements such as MOSFETs (Metal Oxide Semiconductor Field-Effect Transistors) are provided on a surface layer portion of the semiconductor substrate 2.

A first interlayer dielectric film 3 made of $SiO_2$ (silicon oxide) is formed on the semiconductor substrate 2. The first interlayer dielectric film 3 is formed by CVD (Chemical Vapor Deposition), for example.

A wiring trench 4 of a prescribed pattern is dug in the first interlayer dielectric film 3 from the upper surface thereof. A wire 5 made of Cu is embedded in the wiring trench 4. The wire 5 is formed by the damascene process. The side surface and the bottom surface of the wire 5 are covered with a barrier film 6 made of a Ta (tantalum)-based material having barrier properties against diffusion of Cu. The barrier film 6 is formed by sputtering, for example. The Ta-based material includes Ta or TaN (tantalum nitride), for example.

A barrier film 7 made of SiC (silicon carbide) having barrier properties against diffusion of Cu is formed on the first interlayer dielectric film 3 and the wire 5. A second interlayer dielectric film 8 made of $SiO_2$ is laminated on the barrier film 7. The barrier film 7 and the second interlayer dielectric film 8 are formed by CVD, for example.

Figure 2:
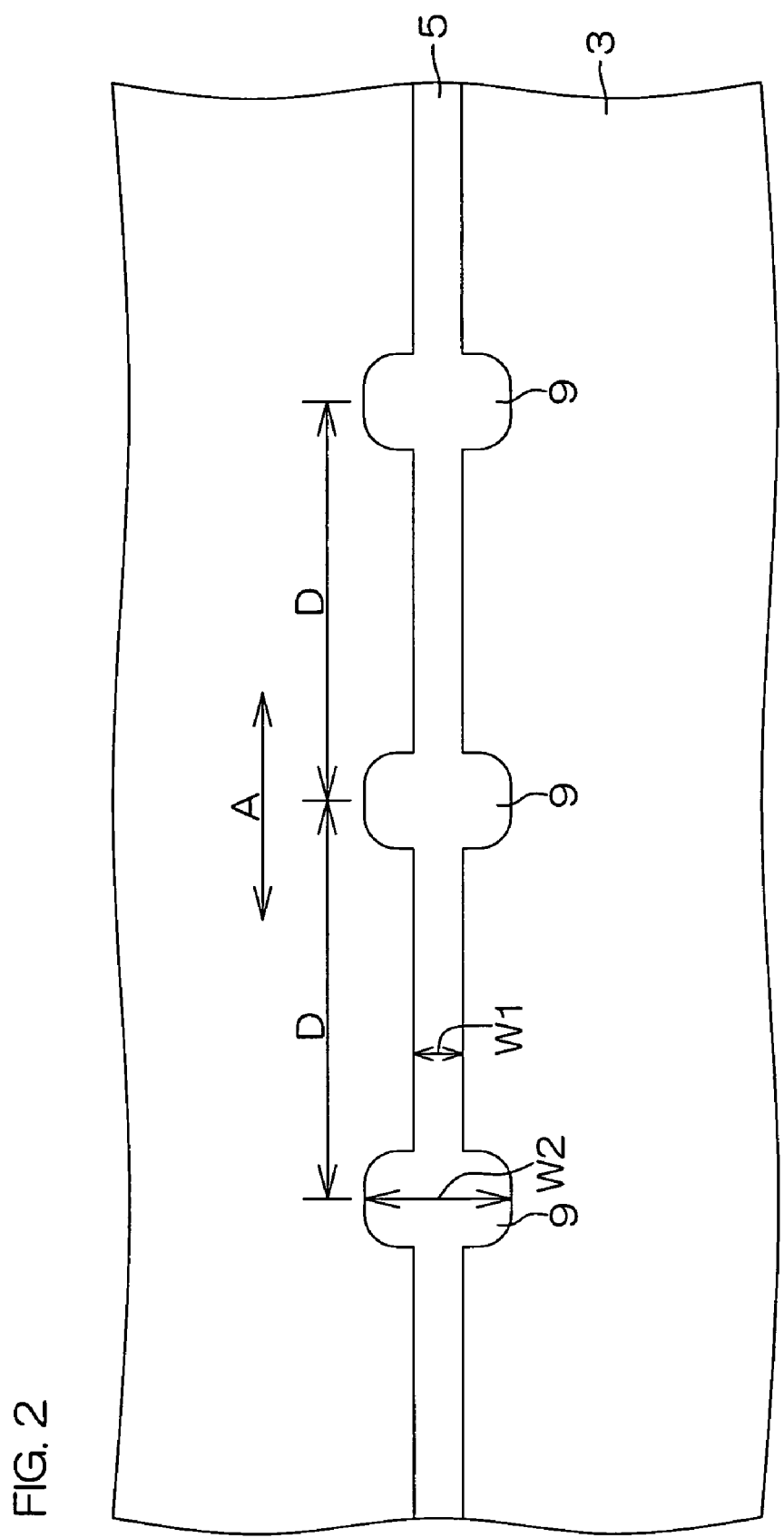
FIG. 2 is a schematic plan view of a wire shown in FIG. 1.

FIG. 2 is a schematic plan view of the wire shown in FIG. 1.

The wire 5 is formed to extend in a prescribed direction A on the first interlayer dielectric film 3. A plurality of broad portions 9 are integrally formed on the wire 5. The broad portions 9 are formed at regular intervals D in the prescribed direction A. Each broad portion 9 extends from the side surface of the wire 5 toward both sides in the width direction (direction orthogonal to the prescribed direction A) of the wire 5 generally semicircularly in plan view. The width W2 of the broad portion 9 is about twice the width W1 of the wire 5, for example. When the width W1 of the wire 5 is 0.4 μm, the width W2 of the broad portion 9 is 0.8 μm.

When stress resulting from thermal contraction difference between the wire 5 and the second interlayer dielectric film 8 is applied to the wire 5 after the second interlayer dielectric film 8 is formed on the wire 5, therefore, the broad portion 9 can absorb this stress. Consequently, the wire 5 can be prevented from disconnection resulting from such stress.

The interval D between the broad portions 9 is preferably not less than 100 μm and not more than 300 μm. The interval D is so set to not more than 300 μm that each pair of broad portions 9 can excellently absorb stress applied to the wire 5 between these broad portions 9. Further, the interval D is so set to not less than 100 μm that the broad portions 9 can be prevented from hindering refinement of the wire 5.

In addition, the broad portions 9 are so arranged at the regular intervals D that the wire 5 can be prevented from partial stress concentration. Therefore, the wire 5 can be more excellently prevented from disconnection resulting from stress.

The wire 5 may be made of a metallic material containing Al (aluminum). In this case, the wiring trench 4 may not be formed in the first interlayer dielectric film 3, but the wire 5 may be formed on a generally planar surface of the first interlayer dielectric film 3 in a prescribed pattern.

The broad portions 9 may not necessarily be formed at the regular intervals D, but may be formed at irregular pitches.

Further, the broad portions 9, extending toward both sides of the wire 5 from the side surface thereof in this embodiment, may alternatively extend only toward one side of the wire 5.

The material for the barrier film 6 is not restricted to the Ta-based material, but the barrier film 6 may alternatively be made of another material such as $Mn_xSi_yO_z$ (x, y and z: numbers greater than zero), for example, so far as the same has barrier properties against diffusion of Cu.

Figure 3:
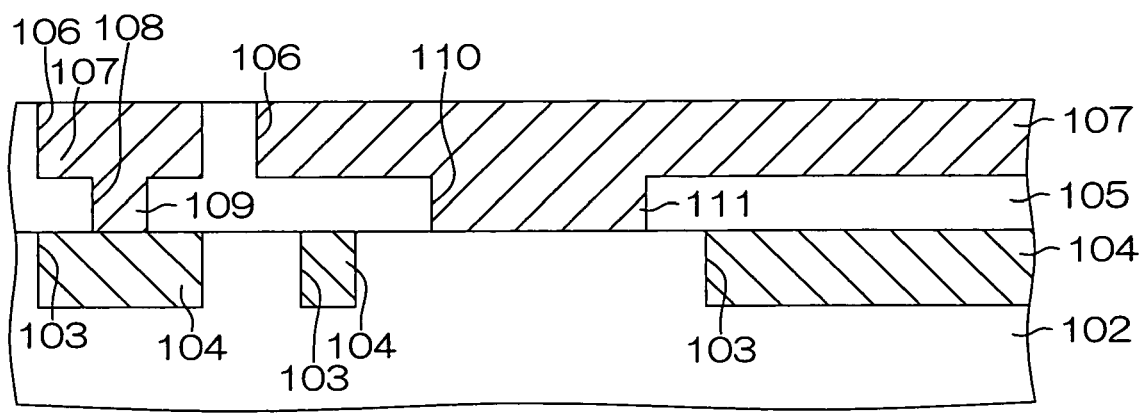
FIG. 3 is a schematic sectional view showing the structure of a semiconductor device according to a second embodiment of the present invention.

FIG. 3 is a schematic sectional view showing the structure of a semiconductor device according to a second embodiment of the present invention. Referring to FIGS. 3 and 4A to 4G, portions other than those made of conductive materials are not hatched, in order to avoid complication of the illustrations.

The semiconductor device 101 includes an unillustrated semiconductor substrate (silicon substrate, for example). Elements such as MOSFETs (Metal Oxide Semiconductor Field-Effect Transistors) are provided on a surface layer portion of the semiconductor substrate.

A first interlayer dielectric film 102 made of $SiO_2$ (silicon oxide) is formed on the semiconductor substrate. First wiring trenches 103 are dug in a surface layer portion of the first interlayer dielectric film 102 from the upper surface thereof in a prescribed pattern. First wires 104 made of Cu (copper) as lower wires are embedded in the first wiring trenches 103.

A second interlayer dielectric film 105 made of $SiO_2$ is formed on the first interlayer dielectric film 102 and the first wires 104. Second wiring trenches 106 are dug in a surface layer portion of the second interlayer dielectric film 105 from the upper surface thereof in a prescribed pattern. Second wires 107 made of Cu as upper wires are embedded in the second wiring trenches 106.

A via hole 108 penetrating through the second interlayer dielectric film 105 interposed between the first and second wires 104 and 107 is selectively formed in the region where the corresponding first and second wires 104 and 107 are opposed to each other. A via 109 made of Cu is provided in the via hole 108. Thus, the first and second wires 104 and 107 are electrically connected with each other through the via 109.

A thick portion trench 110 is dug in the corresponding second wiring trench 106 from the bottom surface thereof in a region not provided with the first wires 104 in plan view. The thick portion trench 110 penetrates through the second interlayer dielectric film 105 in the thickness direction, and the bottom surface thereof is formed by the upper surface of the first interlayer dielectric film 102. The thick portion trench 110 is filled up with the material for the corresponding second wire 107, whereby this second wire 107 integrally has a thick portion 111 embedded in the thick portion trench 110.

Since the second wire 107 is integrally provided with the thick portion 111, when stress resulting from thermal contraction difference between the second wire 107 and the second interlayer dielectric film 105 is applied to the second wire 107, therefore, the thick portion 111 can absorb the stress. Consequently, the second wire 107 can be prevented from disconnection resulting from stress also if the width thereof is not more than 0.4 µm.

FIGS. 4A to 4G are schematic sectional views successively showing the steps of manufacturing the semiconductor device shown in FIG. 3.

Figure 4A:
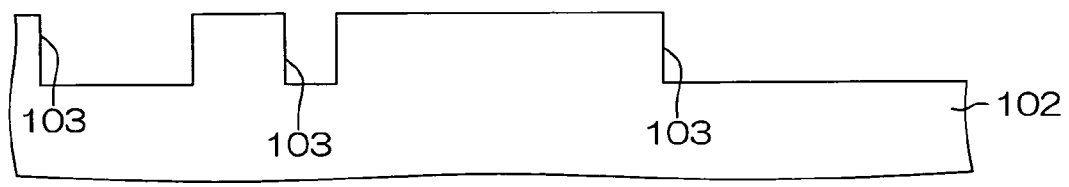
FIG. 4A is a schematic sectional view for illustrating a method of manufacturing the semiconductor device shown in FIG. 3.

First, a semiconductor substrate having the first interlayer dielectric film 102 on the outermost surface thereof is prepared. Then, the first wiring trenches 103 are formed on the surface of the first interlayer dielectric film 102 by photolithography and etching, as shown in FIG. 4A.

Figure 4B:
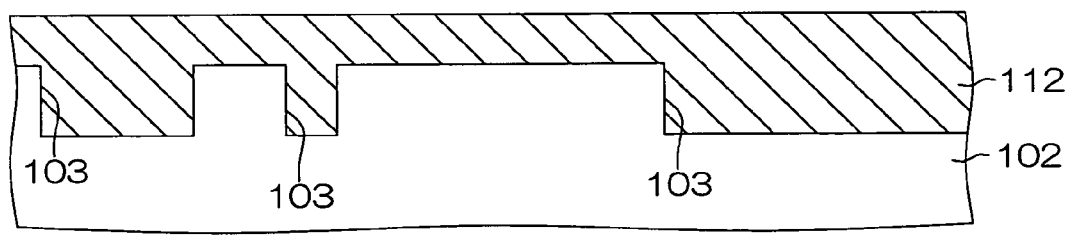
FIG. 4B is a schematic sectional view showing the next step of the step shown in FIG. 4A.

Thereafter a plating layer 112 made of Cu is formed on the interlayer dielectric film 102 including the inner surfaces of the first wiring trenches 103 by plating, as shown in FIG. 4B.

Figure 4C:
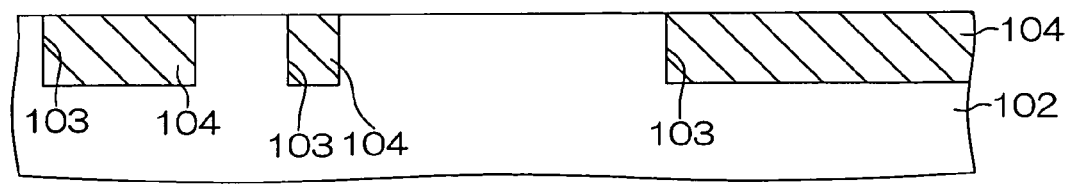
FIG. 4C is a schematic sectional view showing the next step of the step shown in FIG. 4B.

Then, the plating layer 112 is so polished by CMP (Chemical Mechanical Polishing) that portions of the plating layer 112 located outside the first wiring trenches 103 are removed, as shown in FIG. 4C. Thus, the surface of the first interlayer dielectric film 102 is exposed, and the first wires 104 having surfaces generally flush with the surface of the first interlayer dielectric film 102 are obtained.

Figure 4D:
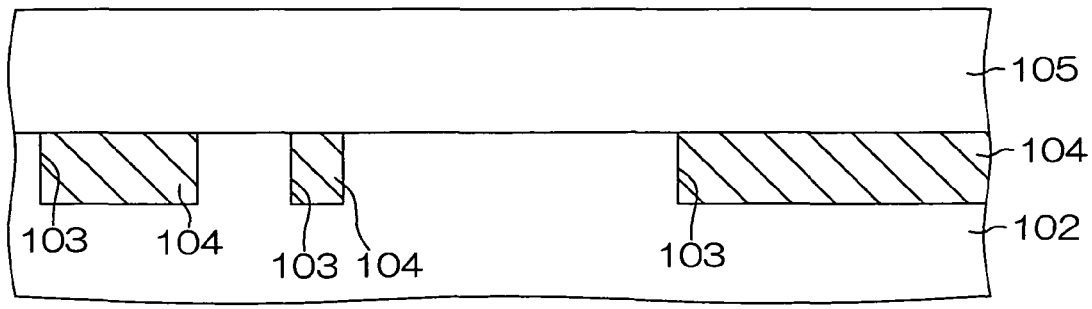
FIG. 4D is a schematic sectional view showing the next step of the step shown in FIG. 4C.

Then, the second interlayer dielectric film 105 is laminated on the first interlayer dielectric film 102 and the first wires 104 by CVD (Chemical Vapor Deposition), as shown in FIG. 4D.

Figure 4E:
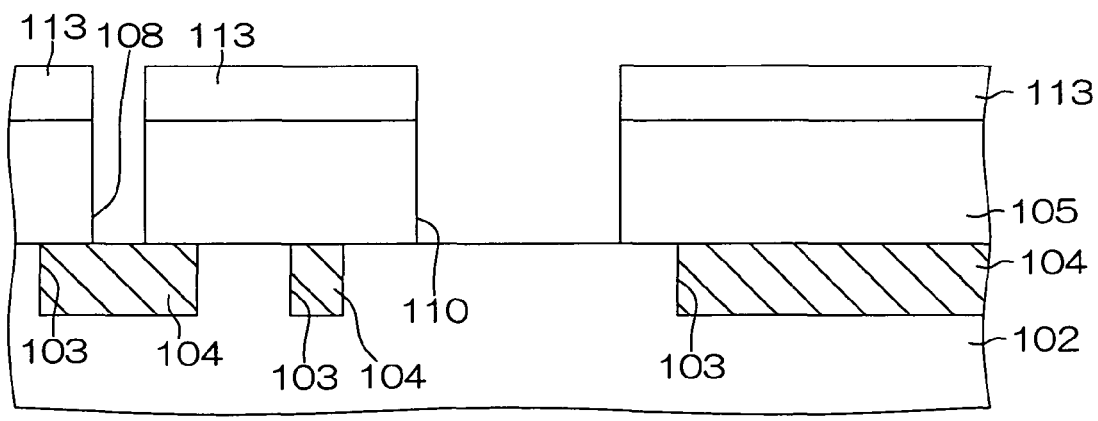
FIG. 4E is a schematic sectional view showing the next step of the step shown in FIG. 4D.

Thereafter a resist film 113 is formed on the second interlayer dielectric film 105, as shown in FIG. 4E. The resist film 113 has openings opposed to portions for forming the via hole 108 and the thick portion trench 110 respectively. The second interlayer dielectric film 105 is etched through the resist film 113 serving as a mask, to form the via hole 108 and the thick portion trench 110. The resist film 113 is removed after the formation of the via hole 108 and the thick portion trench 110.

Figure 4F:
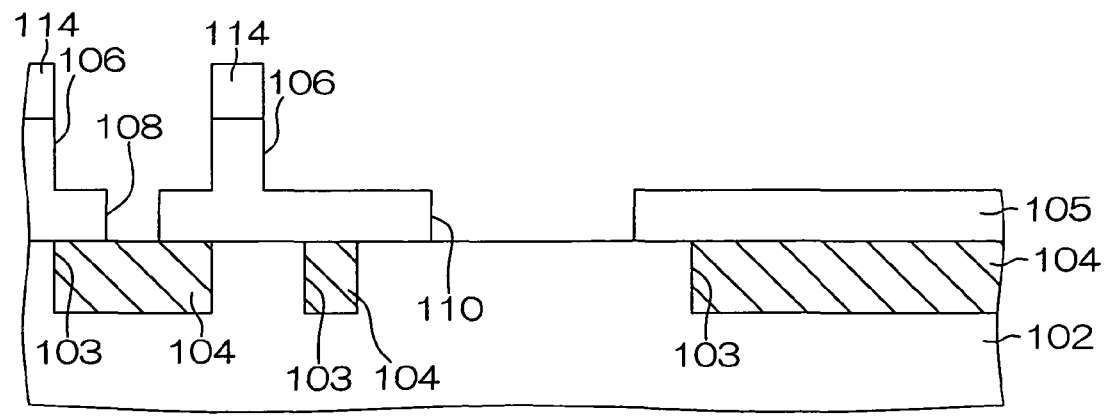
FIG. 4F is a schematic sectional view showing the next step of the step shown in FIG. 4E.

Then, another resist film 114 is formed on the second interlayer dielectric film 105, as shown in FIG. 4F. The resist film 114 has openings opposed to portions for forming the second wiring trenches 106. The second interlayer dielectric film 105 is etched through the resist film 114 serving as a mask, to form the second wiring trenches 106. The resist film 114 is removed after the formation of the second wiring trenches 106.

Figure 4G:
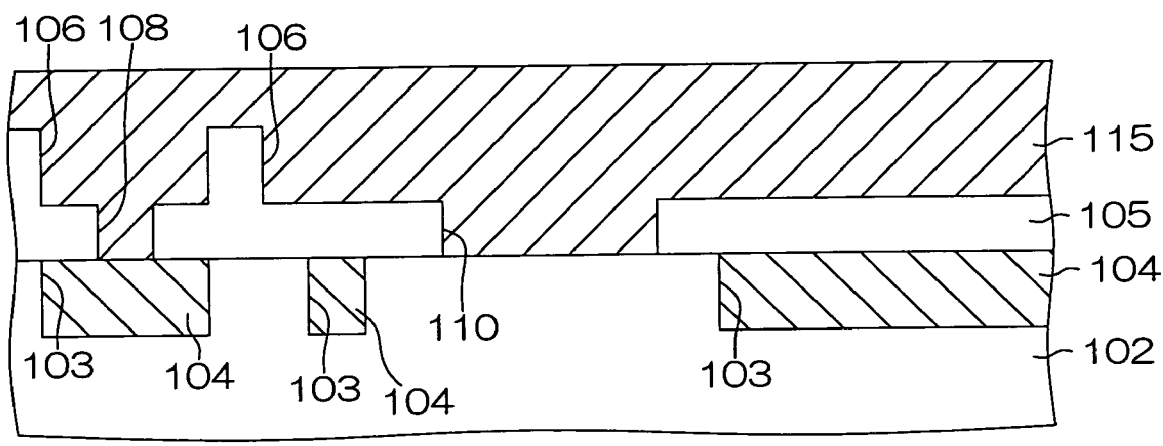
FIG. 4G is a schematic sectional view showing the next step of the step shown in FIG. 4F.

Then, a plating layer 115 made of Cu is formed on the second interlayer dielectric film 105 including the inner surfaces of the second wiring trenches 106, the via hole 108 and the thick portion trench 110 by plating, as shown in FIG. 4G. This plating layer 115 is formed in a thickness filling up the second wiring trenches 106.

Thereafter portions of the plating layer 115 located outside the second wiring trenches 106 are removed by CMP. Thus, the surface of the second interlayer dielectric film 105 is exposed, and the second wires 107 having surfaces generally flush with the surface of the second interlayer dielectric film 105, the via 109 embedded in the via hole 108 and the thick portion 111 embedded in the thick portion trench 110 are formed. Thus, the semiconductor device 101 shown in FIG. 3 is obtained.

As hereinabove described, the via hole 108 penetrating through the second interlayer dielectric film 105 is formed between the corresponding first and second wires 104 and 107. The via 109 for electrically connecting the first and second wires 104 and 107 with each other is embedded in the via hole 108. The thick portion trench 110 so penetrates through the second interlayer dielectric film 105 that the via hole 108 and the thick portion trench 110 can be formed in the same step. Therefore, the thick portion trench 110 can be formed without increasing the number of the manufacturing steps.

Barrier films (not shown) each made of a material having barrier properties against diffusion of Cu are properly formed between the first wires 104 and the first interlayer dielectric film 102, between the first wires 104 and the second interlayer dielectric film 105, between the second wires 107 and the second interlayer dielectric film 105, between the via 109 and the second interlayer dielectric film 105, between the thick portion 111 and the first interlayer dielectric film 102 and between the thick portion 111 and the second interlayer dielectric film 105 respectively.

The first wires 104 may alternatively be made of a metallic material containing Al (aluminum). In this case, the wiring trenches 103 may not be formed in the first interlayer dielectric film 102, but the first wires 104 may be formed on a generally planar surface of the first interlayer dielectric film 102 in a prescribed pattern.

The second wires 107, the via 109 and the thick portion 111, made of Cu in this embodiment, may not be made of only Cu, but may be made of a material containing Cu as a main component.

The thick portion trench 110 may not penetrate through the second interlayer dielectric film 105, but may be formed as a recess dug in the corresponding second wiring trench 106 from the bottom surface thereof.

While the present invention has been described in detail byway of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-274043 and Japanese Patent Application No. 2007-274044 filed with the Japan Patent Office on Oct. 22, 2007, the disclosures of these applications are incorporated herein by reference.

What is claimed is:

1. A semiconductor device comprising:
 a semiconductor layer;
 a first interlayer dielectric film formed on the semiconductor layer;
 a wire formed on the first interlayer dielectric film with a metallic material to have a width of not more than 0.4 μm; and
 a broad portion integrally formed with the wire to extend from the wire in the width direction thereof, the broad portion extending semicircularly in a plan view from the wire.

2. The semiconductor device according to claim 1, wherein a plurality of the broad portions are provided at a prescribed interval in a direction along the wire.

3. The semiconductor device according to claim 2, wherein the prescribed interval is not less than 100 μm and not more than 300 μm.

4. The semiconductor device according to claim 2, wherein the broad portions are arranged at regular intervals.

5. The semiconductor device according to claim 1, wherein the broad portion extends toward both sides of the wire.

6. The semiconductor device according to claim 1, wherein the broad portion extends toward at least one side of the wire.

7. The semiconductor device according to claim 1, further comprising a second interlayer dielectric film or a passivation film formed on the wire and the broad portion.

8. The semiconductor device according to claim 1, wherein the wire is made of Cu.

9. The semiconductor device according to claim 1, further comprising a barrier film having barrier properties against diffusion of Cu.

10. The semiconductor device according to claim 9, wherein the barrier film is made of a Ta-based material.

11. The semiconductor device according to claim 1, wherein the first interlayer dielectric film is made of $SiO_2$.

12. A semiconductor device comprising:
 a lower wire;
 an interlayer dielectric film laminated on the lower wire; and
 an upper wire embedded in a wiring trench dug in the interlayer dielectric film from the upper surface thereof and made of a metallic material mainly composed of Cu, with a width of not more than 0.4 μm, wherein
 a thick portion trench is dug in the wiring trench from the bottom surface of the wiring trench in a region not provided with the lower wire in plan view, and
 the upper wire has a thick portion integrally formed by filling up the thick portion trench with the metallic material.

13. The semiconductor device according to claim 12, wherein the thick portion trench penetrates through the interlayer dielectric film in the thickness direction.

14. The semiconductor device according to claim 12, wherein a via penetrating through the interlayer dielectric film interposed between the lower wire and the upper wire is provided in a region where the lower and upper wires are opposed to each other.

15. The semiconductor device according to claim 14, wherein the via is made of Cu.

16. The semiconductor device according to claim 12, wherein the interlayer dielectric film is made of $SiO_2$.

17. The semiconductor device according to claim 12, wherein the lower wire is made of Cu.

18. A semiconductor device comprising:
 a semiconductor substrate;
 a first interlayer dielectric film formed on the semiconductor substrate;
 a first wiring trench dug in the interlayer dielectric film from an upper surface thereof;
 a first wire embedded in the first wiring trench;
 a second interlayer dielectric film stacked on the first wire; and
 a second wire embedded in a second wiring trench dug in the second dielectric film from an upper surface thereof and made of a metallic material mainly composed of Cu, with a width of not more than 0.4 μm, wherein
 a thick portion trench is dug in the second wiring trench from a bottom surface of the second wiring trench in a region not provided with the first wire in a plan view, and
 the second wire has a thick portion integrally formed by filling up the thick portion trench with the metallic material.

19. The semiconductor device according to claim 18, wherein a via penetrating through the second interlayer dielectric film interposed between the first and second wires is provided in a region where the first and second wires are opposed to each other.

20. The semiconductor device according to claim 18, wherein further comprising a barrier film provided between the first wire and the first interlayer dielectric film.

21. The semiconductor device according to claim 18, wherein further comprising a barrier film provided between the first wire and the second interlayer dielectric film.

22. The semiconductor device according to claim 18, wherein further comprising a barrier film provided between the second wire and the second interlayer dielectric film.

23. The semiconductor device according to claim 22, wherein further comprising a barrier film provided between the thick portion of the second wire and the first interlayer dielectric film.

24. The semiconductor device according to claim 18, wherein further comprising a barrier film provided between the thick portion of the second wire and the second interlayer dielectric film.

25. The semiconductor device according to claim 18, wherein further comprising a barrier film provided between the via and the second interlayer dielectric film.

* * * * *